United States Patent
Susuki et al.

(10) Patent No.: US 7,038,955 B2
(45) Date of Patent: May 2, 2006

(54) SEMICONDUCTOR DEVICE AND TESTING APPARATUS FOR SEMICONDUCTOR DEVICE

(75) Inventors: Masato Susuki, Kawasaki (JP); Hiroshi Nakadai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 223 days.

(21) Appl. No.: 10/815,825

(22) Filed: Apr. 2, 2004

(65) Prior Publication Data

US 2005/0094450 A1    May 5, 2005

(30) Foreign Application Priority Data

Nov. 4, 2003    (JP) .............................. 2003-374351

(51) Int. Cl.
*G11C 7/00*    (2006.01)
(52) U.S. Cl. ............ 365/201; 365/189.01; 365/189.07; 365/194
(58) Field of Classification Search ................ 365/201, 365/189.01, 189.07, 194
See application file for complete search history.

(56) References Cited

U.S. PATENT DOCUMENTS

| 5,568,437 A | * | 10/1996 | Jamal .......................... 365/201 |
| 6,359,818 B1 | * | 3/2002 | Suzuki ......................... 365/201 |
| 6,567,325 B1 | * | 5/2003 | Hergott ....................... 365/201 |

FOREIGN PATENT DOCUMENTS

| JP | 10-302499 | 11/1998 |
| JP | 11-238400 | 8/1999 |
| JP | 2002-133897 | 5/2002 |
| JP | 2002-298598 | 10/2002 |

\* cited by examiner

*Primary Examiner*—Richard Elms
*Assistant Examiner*—Toan Le
(74) *Attorney, Agent, or Firm*—Staas & Halsey LLP

(57) ABSTRACT

For the purpose of providing an inexpensive memory from which test results can be certainly read out, a semiconductor device having a BIST circuit (built-in self test circuit) includes a RAM for use in processing to be tested incorporated in a data processing system, a built-in self test circuit making a built-in self test on the RAM for use in processing, and a RAM for tester storing test results of the RAM for use in processing obtained by the built-in self test circuit so that the test results can be read out by an external tester, wherein a RAM having a data read-out margin greater than a data read-out margin of the RAM for use in processing is used as the RAM for tester.

36 Claims, 7 Drawing Sheets

FIG. 5

| SW[62S] | SW[63S] | THE NUMBER OF STAGES OF INVERTORS 64 |
|---|---|---|
| 62L | 63L | 2 |
| 62L | 63H | 4 |
| 62H | 63L | 6 |
| 62H | 63H | 8 |

FAST

↕

SLOW

SEMICONDUCTOR DEVICE AND TESTING APPARATUS FOR SEMICONDUCTOR DEVICE

BACKGROUND OF THE INVENTION

1) Field of the Invention

The present invention relates to a semiconductor device having a BIST (Built In Self Test) circuit to test a memory (RAM: Random Access Memory) for use in processing incorporated in a data processing system of the semiconductor device, and a testing apparatus for the semiconductor device.

2) Description of the Related Art

As a method for testing a memory of a semiconductor device such as an LSI (Large Scale Integration) or the like, there is a testing method using a BIST (Built In Self Test) circuit, for example (refer to patent documents 1 through 4 mentioned below).

A semiconductor device with the BIST circuit has a structure shown in, for example, FIG. 7. As shown in FIG. 7, the semiconductor device 100 comprises a memory (for example, a RAM: Random Access Memory) 101 incorporated in a data processing system of the semiconductor device 100 to be tested, a BIST circuit 102, a control circuit 103, a checker 104, and a latch array for storing data 105. A tester 110 is detachably connected from the outside to the semiconductor device 100.

The memory (hereinafter referred as a RAM) 101 functions as a memory of the semiconductor device 100, configured as a so-called DRAM (Dynamic Random Access Memory), SRAM (Static Random Access Memory) or the like.

The BIST circuit 102 is a circuit for making a built-in self test on the RAM 101. The BIST circuit 102 issues, to a RAM 101, a test pattern including data to be written into the RAM 101 and an address of a position (that is, an address in the RAM 101) at which the data is to be written, prepares an expected value of the test pattern, and transmits the expected value to the checker 104 to be described later.

The control circuit 103 is a circuit for controlling the BIST circuit 102. Practically, the control circuit 103 controls a start/end of the test by the BIST circuit 102.

After a writing into the RAM 101 on the basis of the test pattern generated by the BIST circuit 102, the checker 104 compares data read out from the RAM 101 with an expected value corresponding to the test pattern prepared by the BIST circuit 102, and transmits a result of the comparison to the latch array for storing data 105 to be described later.

A result of the comparison transmitted from the checker 104 to the latch array for storing data 105 represents whether or not the data read out from the RAM 101 agrees with the expected value as data of 1 or 0, which is generated for each test pattern generated by the BIST circuit 102, and is transmitted to the latch array for storing data 105. When the data read out from the RAM 101 agrees with the expected value, "1" is transmitted to the latch array for storing data 105 as a result of the comparison. When the data does not agree with the expected value, "0" is transmitted.

The latch array for data storing 105 stores a result of the comparison transmitted from the checker 104, which is a so-called first-in first-out memory latch array.

The tester 110 is detachably connected to the outside of the semiconductor device 100 to take out results of the comparison stored in the latch array for storing data 105.

In the known semiconductor device 100 structured as above, the tester 110 is connected to the semiconductor device 100, and the control circuit 103 controls the BIST circuit 102 to start the test. The BIST circuit 102 successively issues test patterns to the RAM 101, writes a plurality of patterns in the RAM 101, prepares an expected value for each of the test patterns, and transmits the expected value to the checker 104. The checker 104 compares data read out from the RAM 101 with the expected value transmitted from the BIST circuit 102, and transmits whether or not the data agrees with the expected value as a result of the comparison (here, "1" in the case where the data agrees with the expected value or "0" in the case where the data does not agree with the expected value) to the data array for storing data 105. The result of the comparison is stored in the latch array for storing data 105. The tester 110 takes out results of the test (results of comparison) stored in the latch array for storing data 105, and evaluates the results, thereby to test the RAM 101.

In the known semiconductor device 100 shown in FIG. 7, it is general that the tester 110 is manufactured in a technology in older generation than the semiconductor device 100. Accordingly, the processing speed of the tester 110 is lower than the processing speed of the semiconductor device 100. Even if a device (MPU: Micro Processing Unit, CPU: Central Processing Unit or the like) of the semiconductor device 100 to be tested is operated at fast clock cycle, the processing speed of a device (MPU, CPU or the like) of the tester 110 cannot catch up with the clock cycle of the semiconductor device 100. As a result, the tester 110 cannot read out results of comparison written in the latch array for data storing 105 at the fast clock cycle of the semiconductor device 100. In guaranteeing the product operations, it is an important element in the test on the RAM 101 to shift the addresses in the RAM 101 one after another, and successively read and write the data. In the known semiconductor device 100 shown in FIG. 7, there is no alternative but to adjust the processing speed of the device of the semiconductor device 100 to the processing speed of the tester 110 and make the test at the lower clock cycle. It is thus impossible to test the RAM 101 at the original processing speed of the semiconductor device 100.

Even if a tester 110 having a device (a CPU or the like) operable at a processing speed equivalent to that of the semiconductor device 100 is prepared using a technology equivalent to that used to manufacture the semiconductor device 100, such tester 110 would be very costly. Additionally, it is not realistic to prepare a tester equivalent to the semiconductor device each time the semiconductor device to be tested is developed.

In the known semiconductor device 100 shown in FIG. 7, the latch array for storing data 105 storing results of comparison obtained by the checker 104 has generally a smaller capacity than the RAM 101. Accordingly, there is a case where the latch array 105 cannot store all results of the test successively made on the whole RAM 101. It is important in the test on the RAM 101 in order to guarantee the product operation to successively carry out reading and writing of data at all addresses in the RAM 101. In the above latch array for storing data 105, it is necessary to divide the test on the RAM 101 into parts and make the test plural times, which is an obstacle to a guarantee of reliable operations of the product.

In the test of the semiconductor device 100, it is very effective to investigate in which physical position (i.e., at which address) of the cell array of the RAM 101 a failure occurs, that is, it is very effective to prepare a bit failure map. However, the first-in first-out latch array for storing data 105 cannot store a result of comparison with an address designated, thus it is impossible to prepare a bit failure map at the time of a testing operation of the RAM 101.

Accordingly, there is proposed a technique solving the above problem by newly providing, instead of the latch array for storing data 105, a memory (RAM) equivalent to the RAM 101 outside the semiconductor device 100 to store results of comparison obtained by the checker 104 therein (refer to patent documents 1 through 4 below, for example).

[Patent Document 1] Japanese Patent Laid-Open Publication No. 2002-298598

[Patent Document 2] Japanese Patent Laid-Open Publication No. 11-238400

[Patent Document 3] Japanese Patent Laid-Open Publication No. 10-302499

[Patent Document 4] Japanese Patent Laid-Open Publication No. 2002-133897

If a RAM having a performance equivalent to that of the RAM 101 is newly provided outside the semiconductor device 100 in order to store results of the test (results of comparison transmitted from the above checker 104), it would cost more than the case where the above latch array for storing data 105 is provided inside the semiconductor device 100, of course.

When the semiconductor device 100 is an MPU, CPU or the like of a server or a personal computer and the RAM 101 to be tested is an SRAM, the cost of the test further increases because the SRAM is very expensive.

RAMs provided as memories in semiconductor devices such MPU, CPU or the like are extensively developed, aimed at high-speed and high-density (large-capacity). If a RAM equivalent to a newly developed RAM is prepared for the test each time a semiconductor device (MPU, CPU or the like) having such the newly developed RAM is developed, the cost would be further increased.

Instead, when a RAM for storing results of the test is provided outside the semiconductor device 100, it is necessary to newly provide an interface and a control system for connecting the RAM to the semiconductor device 100, which causes complication of the system and an increase in cost.

When a built-in self test is made on a memory (RAM) of a semiconductor device using a BIST circuit, the memory for storing results of the test (results of comparison transmitted from the checker 104) has to be configured so that the stored results of the test can be accurately read out, as a matter of course.

However, the latch array for storing data 105 provided in the known semiconductor device 100 shown in FIG. 7 and the techniques disclosed in the patent documents 1 through 4 do not have any means of certainly reading out results of the test written in the memory.

SUMMARY OF THE INVENTION

In the light of the above problem, an object of the present invention is to provide a semiconductor device having a BIST circuit (a built-in self test circuit) with an inexpensive memory from which data can be certainly read out, and a tester for such a semiconductor device.

The present invention therefore provide a semiconductor device comprising a RAM for use in processing incorporated in a data processing system and to be tested, a built-in self test circuit for making a built-in self test on the RAM for use in processing, and a RAM for tester for storing results of the built-in self test on the RAM for use in processing made by the built-in self test circuit so that the results of the built-in self test can be read out by an external tester, a RAM having a data read-out margin greater than a data read-out margin of the RAM for use in processing being used as the RAM for tester.

The present invention further provides a semiconductor device comprising a plurality of RAMs for use in processing incorporated in a data processing system and to be tested, and a built-in self test circuit for making a built-in self test on the RAMs for use in processing, when the built-in self test circuit makes the built-in self test on a part of the plural RAMs for use in processing, a RAM for use in processing, which is not to be tested in the built-in self test, being used as a RAM for tester which stores results of the built-in self test on the RAM(s) for processing made by the built-in self test circuit so that the results of the built-in self test can be read out by an external tester.

It is preferable that each of the plural RAMs for use in processing comprises a margin widening means for increasing a bit line amplitude at the time of a start of a sense amplifier of the RAM to widen a data read-out margin.

It is preferable that the margin widening means comprises a delay circuit for gradually delaying a start timing of the sense amplifier according to a signal fed from the outside.

It is preferable that the margin widening means changes a setting so that a data read-out margin of a RAM used as a RAM for tester among the plural RAMs for use in processing is greater than a data read-out margin of a RAM for use in processing to be tested in the built-in self test.

The present invention still further provides a testing apparatus built in a semiconductor device comprising a RAM for use in processing incorporated in a data processing system and to be tested, the testing apparatus comprising a built-in self test circuit for making a built-in self test on the RAM for use in processing, and a RAM for tester for storing results of the built-in self test on the RAM for use in processing made by the built-in self test circuit so that the results of the built-in self test can be read out by an external tester, a RAM having a data read-out margin greater than a data read-out margin of the RAM for use in processing being used as the RAM for tester.

The present invention still further provides a testing apparatus built in a semiconductor device comprising a plurality of RAMs for use in processing incorporated in a data processing system and to be tested, the testing apparatus comprising a built-in self test circuit for making a built-in self test on the plural RAMs for use in processing, when the built-in self test circuit makes the built-in self test on a part of the plural RAMs for use in processing, a RAM for use in processing, which is not to be tested in the built-in self test, being used as a RAM for tester which stores result of the built-in self test on the RAM(s) for processing made by the built-in self test circuit so that the result of the built-in self test can be read out by an external tester.

Accordingly, it is possible to successively make a built-in self test on the whole of a RAM for use in processing at a processing speed (i.e., the original processing speed of the semiconductor device) based on a device (MPU, CPU or the like) provided in the semiconductor device. This guarantees reliable operations of the product.

Since the RAM for tester has a data read-out margin larger than the data read-out margin of the RAM for use in processing, it is possible to certainly read out results of the test from the RAM for tester. This improves the accuracy of the built-in self test.

According to this invention, when the built-in self test is made on a part of the plural RAMs for use in processing by the built-in self test circuit, a RAM for use in process, which is not to be tested in the built-in self test, is used as a RAM for tester which stores results of the built-in self test on the RAM(s) for use in processing by the built-in self test circuit so that the results of the built-in self test can be read out by an external tester. Unlike the known technique, it is unnecessary to newly provide a RAM having a performance equivalent to that of the RAM for use in processing as a RAM for tester, thus unnecessary to newly provide an interface and a control system therefor. This decreases the cost for the built-in self test.

Further, it is possible to successively make the built-in self test on the whole of the RAM for use in processing at a processing speed (i.e., the original processing speed of the semiconductor device) based on a device (MPU, CPU or the like) provided in the semiconductor device, which guarantees reliable operations of the product.

By widening the data read-out margin of the RAM for tester storing test results of the built-in self test by the margin widening means, it is possible to certainly read out the test results from the RAM for tester, which improves the accuracy of the built-in self test.

Since the margin widening means is provided to each of a plurality of RAMs for use in processing in the semiconductor device, the margin widening means can change the setting so that the data read-out magin of a RAM used as the RAM for tester among the plural RAMs for use in processing is greater than the data read-out margin of the RAM for use in processing to be tested in the built-in self test. Accordingly, it is possible to exchange a RAM for use in processing to be tested with a RAM for tester among the plural RAMs for use in processing. This makes it possible to use the plural RAMs for use in processing rationally, and to make the built-in self test efficiently and at low cost.

BRIEF DESCRIPTION OF THE DRAWINGS

FIG. 5 is a diagram for illustrating the number of stages of inverters switched by switches provided to the delay circuit of the margin expanding means of the semiconductor device according to the embodiment of this invention;

FIG. 6(*b*) is a time chart for illustrating a reading-out operation of a RAM for tester of the semiconductor device according to the embodiment of this invention.

DESCRIPTION OF THE PREFERRED EMBODIMENTS

Hereinafter, an embodiment of the present invention will be described with reference to the drawings.

[1] Embodiment of the Invention

Figure 1:
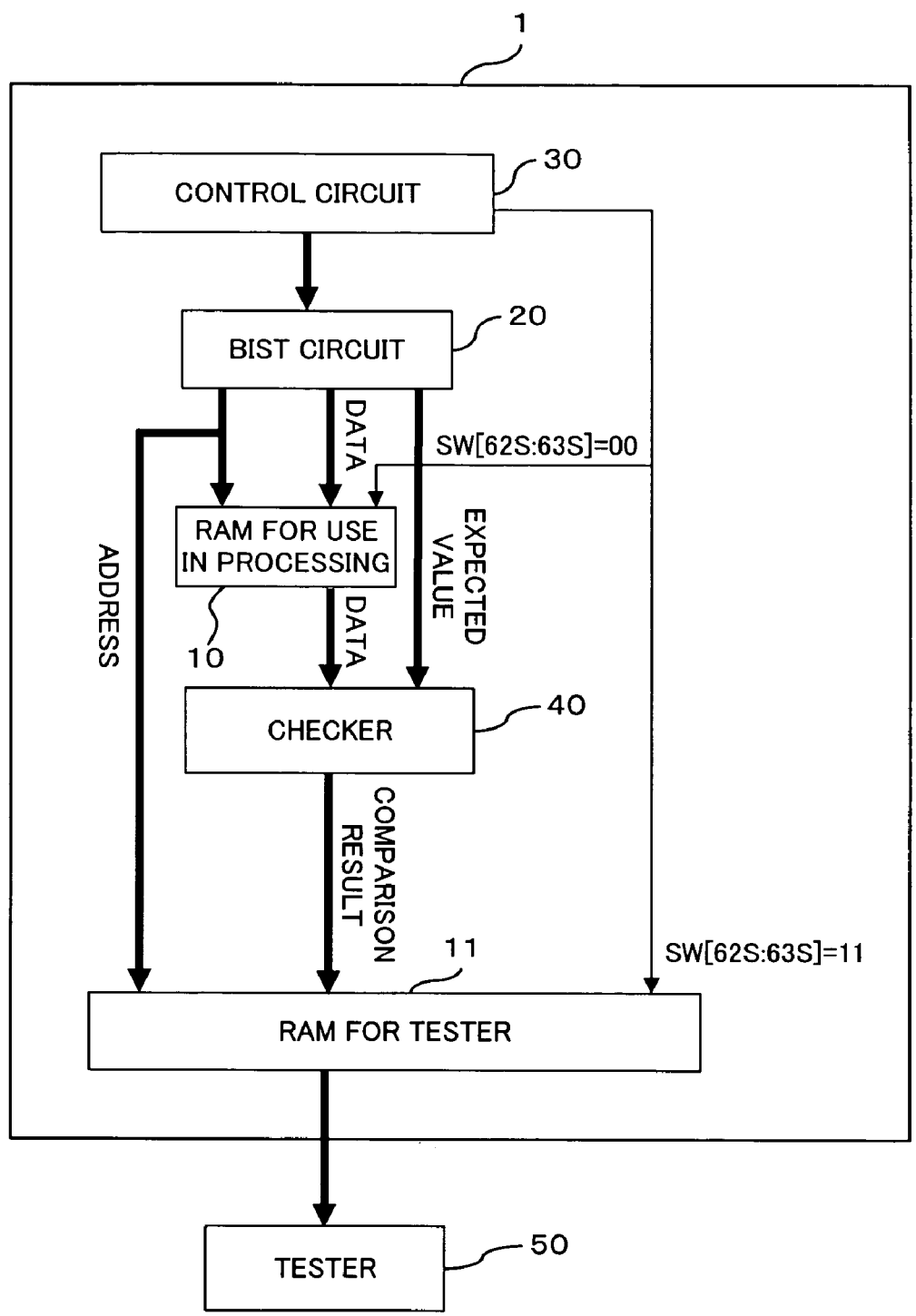
FIG. 1 is a block diagram showing a functional structure of a semiconductor device according to an embodiment of this invention.
Figure 2:
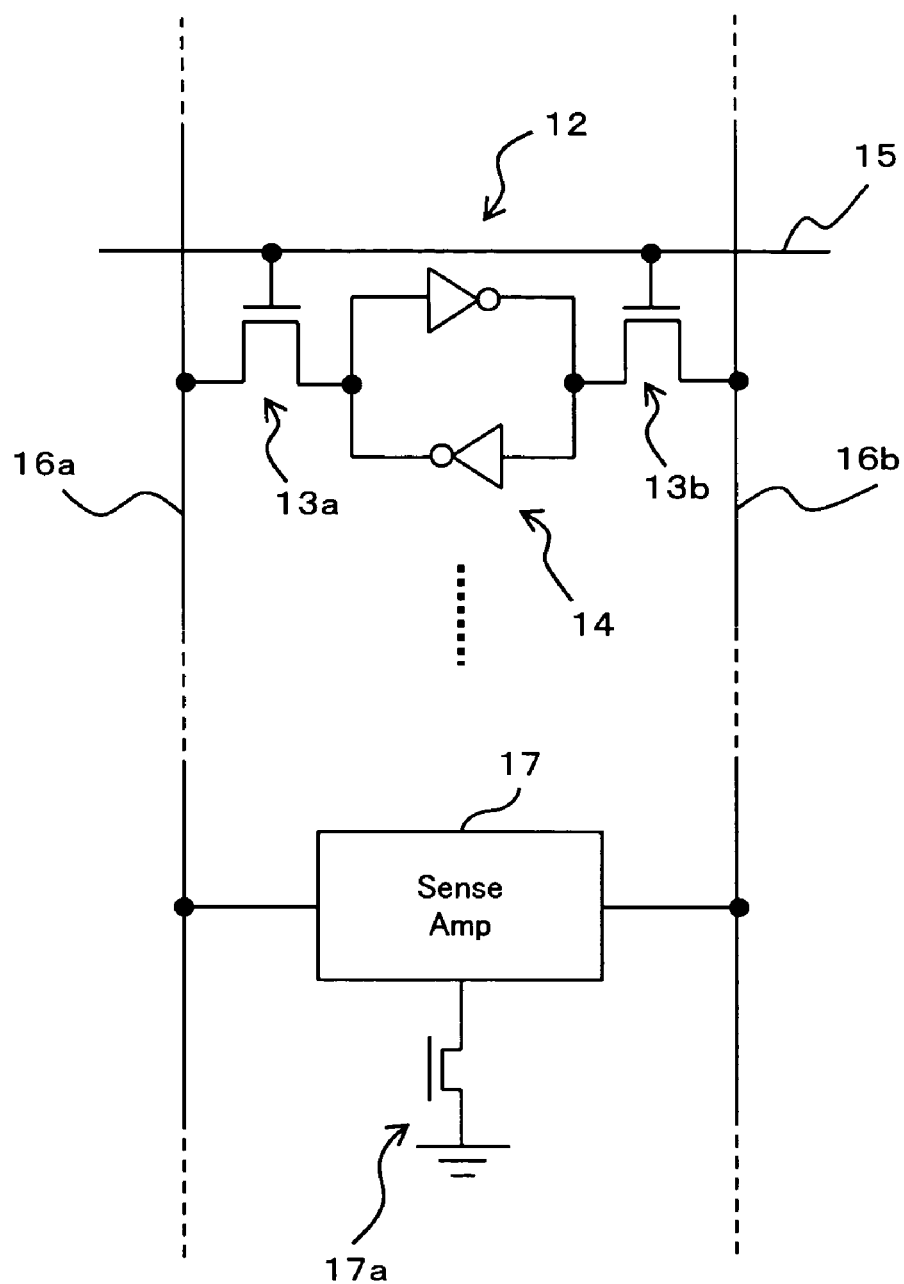
FIG. 2 is a circuit diagram showing structures of a memory cell and a sense amplifier of a RAM of the semiconductor device according to the embodiment of this invention.
Figure 3:
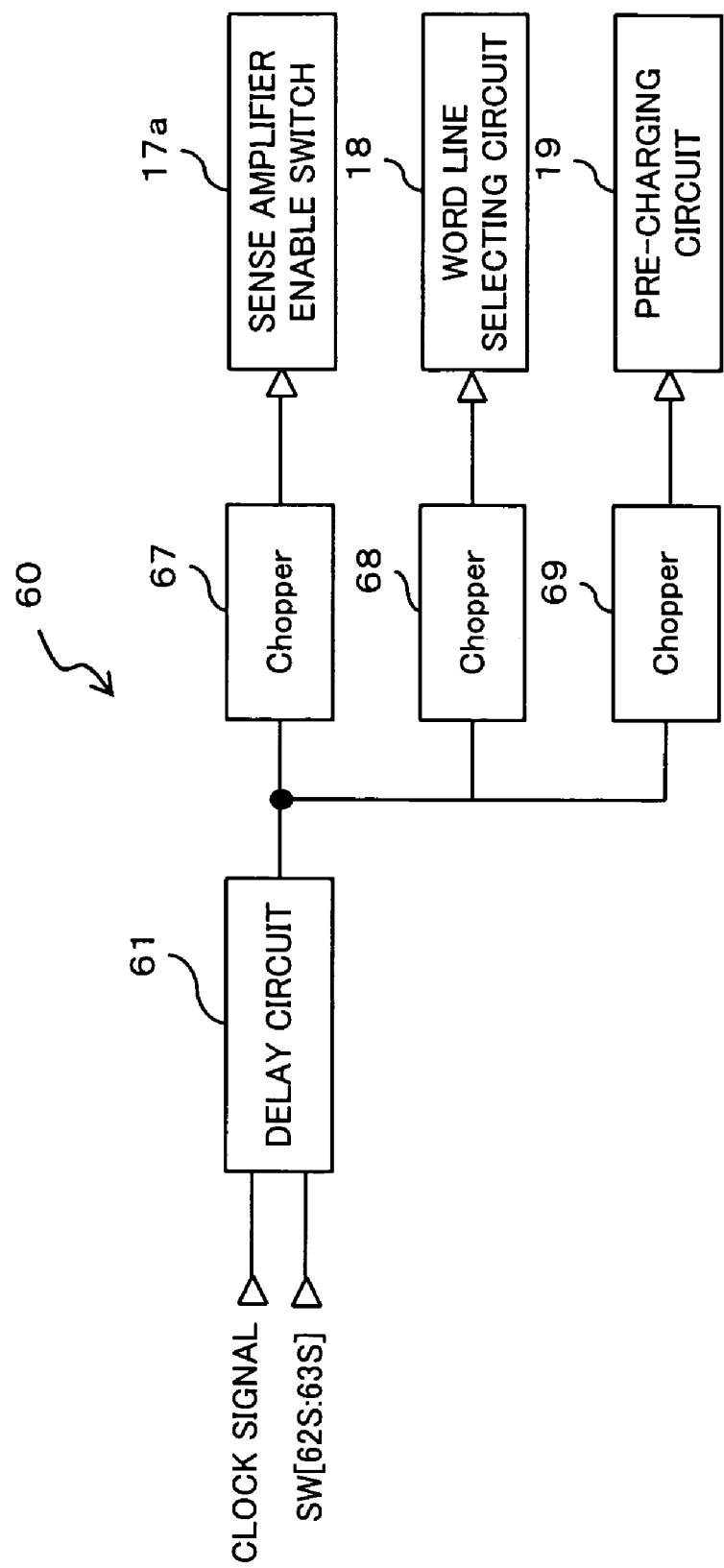
FIG. 3 is a block diagram showing a functional structure of a margin expanding means of the semiconductor device according to the embodiment of this invention.
Figure 4:
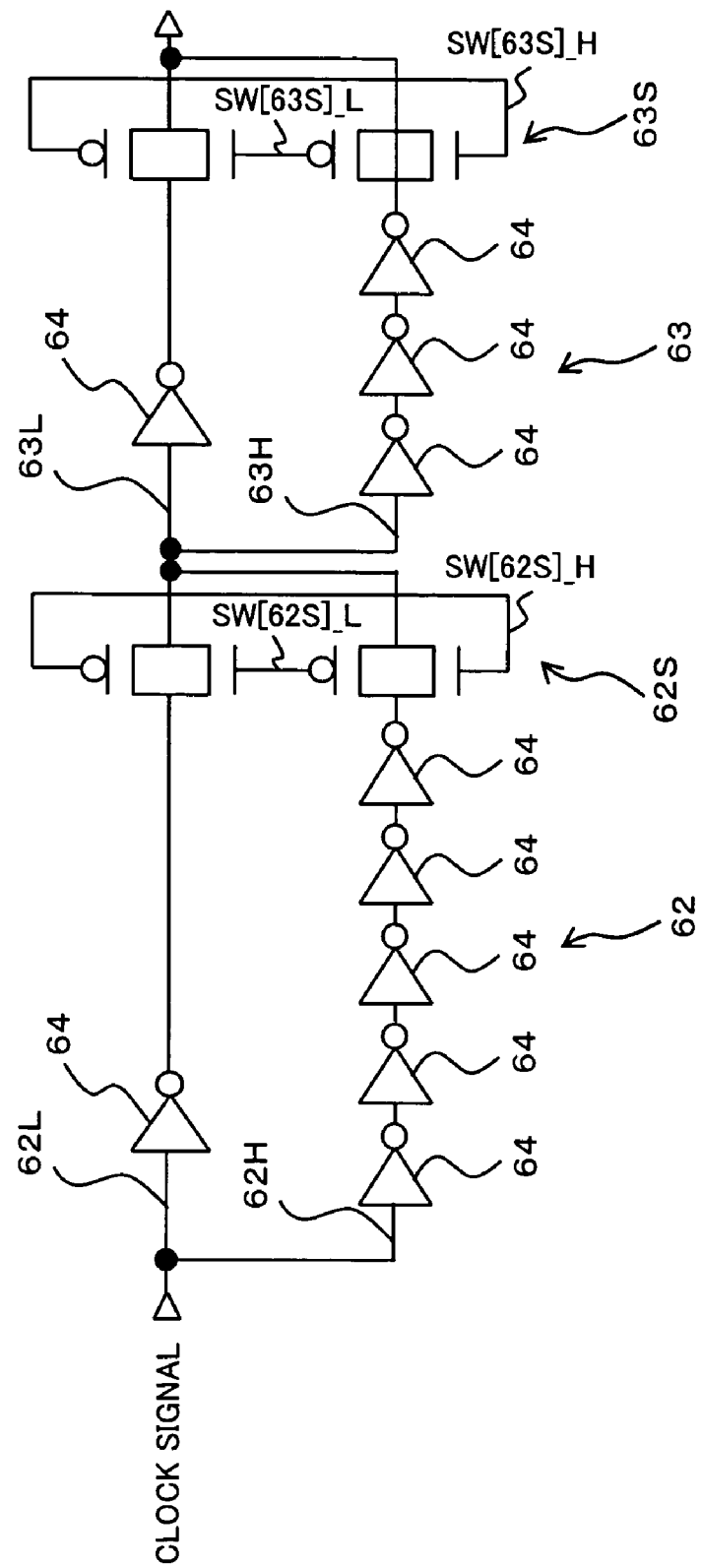
FIG. 4 is a circuit diagram showing a delay circuit of the margin expanding means of the semiconductor device according to the embodiment of this invention.

FIGS. 1 through 6 are diagrams showing a semiconductor device according to an embodiment of this invention. FIG. 1 is a block diagram showing a functional structure of the semiconductor device. FIG. 2 is a circuit diagram showing structures of a memory cell and a sense amplifier of a RAM of the semiconductor device. FIG. 3 is a block diagram showing a functional structure of a margin widening means of the semiconductor device. FIG. 4 is a circuit diagram of a delay circuit of the margin widening means. FIG. 5 is a diagram for illustrating the number of stages of inverters switched by selecting switches provided to the delay circuit of the margin widening means. FIGS. 6(*a*) and 6(*b*) are time charts for illustrating a reading-out operation from the RAM.

A semiconductor device 1 according to the embodiment of this invention is an LSI (Large Scale Integration) being able to function as an MPU, CPU or the like. The semiconductor device 1 comprises a RAM for use in processing 10 built in a data processing system and to be tested, a BIST circuit (a built-in self test circuit) 20 making a built-in self test on the RAM for use in processing 10, a control circuit 30 controlling the built-in self test made by the BIST circuit 20, a checker 40 comparing data written in the RAM for use in processing 10 on the basis of a test pattern generated by the BIST circuit 20 then read out from the RAM for use in processing 10 with an expected value prepared on the basis of the test pattern prepared by the BIST circuit 20, and outputting a result of the comparison as a result of the test, and a RAM for tester 11 storing the result of the test obtained by the checker 40 so that the result of the test can be read out by an external tester 50 to be described later.

The RAM for tester 11 can be connected to the external tester 50.

The RAM for use in processing 10 functions as a memory of the semiconductor device 1. The RAM for use in processing 10 is to be tested in the built-in self test by the BIST circuit 20.

On the other hand, the RAM for tester 11 is incorporated in a data processing system of the semiconductor device 1 like the RAM for use in processing 10, and normally functions as a memory of the semiconductor device 1. Accordingly, the RAM for tester 11 has a performance equivalent to that of the RAM for use in processing 10. Here, the RAM for tester 11 is used as a memory storing results of a test made by the checker 40 so that the results of the test can be read out by the external tester 50. Namely, the semiconductor device 1 has at least two RAMs 10 and 11 in the data processing system, wherein the RAM 10 is to be tested in the built-in self test, while the RAM 11 not to be tested is used as a RAM for tester. When the RAM 11 is put to the built-in self test, the RAM 10 can be used as a RAM for tester, while the RAM 11 can be switched to be tested.

In the RAM for tester 11, a result of the test is stored at the same address as an address in the RAM for use in processing 10 designated by the BIST circuit 20, at which the test data has been written. Namely, a result of the test of data having been written in the RAM for use in processing 10 on the basis of a test pattern generated by the BIST circuit 20 is written at the same address as an address in the RAM for use in processing 10 at which the above data has been written.

In the RAM for tester 11, writing of data on the basis of a test pattern generated by the BIST circuit 20 is performed at a fast clock cycle based on the processing speed of the device (MPU, CPU or the like) of the semiconductor device 1. On the other hand, reading-out of the data written in the RAM for tester 11 is performed at a slow clock cycle based on the processing speed of the device (MPU, CPU or the like) of the tester 50. Namely, in the RAM for tester 11, the process of writing/reading is performed at an inputted clock cycle.

The BIST circuit (built-in self test circuit) 20 successively issues, to the RAM for use in processing 10, test patterns each of which contains data to be written in the RAM for use in processing 10 and a position (i.e., an address in the RAM for use in processing 10) in which the data is to be written. The BIST circuit 20 prepares an expected value for each of the successively issued test patterns, transmits the expected value to the checker 40, and designates the position in which the above data is to be written as an address at which the RAM for tester 11 should write a result of the test.

The control circuit 30 is a circuit for controlling the built-in self test made by the BIST circuit 20. Practically, the control circuit 30 controls a start/end of the built-in self test by the BIST circuit 20, and controls a margin widening means 60 (refer to FIG. 3) provided to each of the RAM for use in processing 10 and the RAM for tester 11. Concretely, a two-bit signal SW [62S and 63S] (SW[62S] and SW[63S]) is transmitted from the control circuit 30 to each of the RAM for use in processing 10 and the RAM for tester 11. The signal SW[62S] and SW[63S] is supplied to switches 62S and 63S equipped to a delay circuit 61 (refer to FIGS. 3 and 4) of the margin widening means 60 in each of the RAMs 10 and 11 to select these switches 62S and 63S, as shown in FIG. 1. In FIG. 4, SW[62S]_L corresponds to an inverted signal of SW[62S], SW[62S]_H corresponds to SW[62S], SW[63S]_L corresponds to an inverted signal of SW[63S], and SW[63S]_H corresponds to SW[63S].

The checker 40 compares data written in the RAM for use in processing 10 on the basis of the test pattern from the BIST circuit 20 then read out from the RAM for use in processing 10 with an expected value prepared by the BIST circuit 20, and transmits whether or not the data and the expected value agree with each other as a result of the test to the RAM for tester 11.

As a result of the test transmitted from the checker 40 to the RAM for tester 11, "1" is generated when the data written in the RAM for use in processing 10 and the expected value agree with each other, or "0" is generated when the data and the expected value do not agree with each other, for each of the successively issued test patterns.

The tester 50 is detachably connected to the semiconductor device 1 to take out a plurality of results of the test stored in the RAM for tester 11 together with addresses at which the results of the test are written, prepares a bit failure map, and outputs the bit failure map as results of the test.

Incidentally, the BIST circuit 20, the control circuit 30, the checker 40 and the RAM for tester 11 together function as a testing apparatus for the semiconductor device 1 having the RAM for use in processing 10 incorporated in the data processing system and to be tested.

Next, description will be made of the RAM for use in processing 10 and the RAM for tester 11 (hereinafter simply referred as RAMs 10 and 11 when the RAM for process 10 and the RAM for tester 11 are not discriminated from each other) normally functioning as memories in the semiconductor device 1 according to this embodiment. The RAMs 10 and 11 provided in the semiconductor device 1 are configured as so-called SRAMs, each of which is an aggregation of a plurality of memory cells 12, as shown in, for example, FIG. 2.

As shown in FIG. 2, the memory cell 12 comprises transistors 13a and 13b, a logic circuit 14 configured with a pair of inverters, a word line 15 corresponding to an address of the memory cell 12, and bit lines 16a and 16b which are signal lines for taking out data from the memory cell 12.

To the bit lines 16a and 16b of the memory cell 12, connected is a sense amplifier (Sense Amp) 17 for amplifying the voltage from the memory cell 12 across the bit lines 16a and 16b. To the sense amplifier 17, attached is a sense amplifier enable (Sense Amp Enable) switch 17a.

To the memory cell, connected are a word line selecting circuit 18 (refer to FIG. 3) for selecting the word line 15, and a pre-charging circuit 19 (refer to FIG. 3) for setting/releasing pre-charge to the bit lines 16a and 16b.

When a difference in voltage between the bit lines 16a and 16b (hereinafter referred as a bit line amplitude) is read out from the memory cell 12 as data retained in the memory cell 12 in the above structure, the difference in voltage (bit line amplitude) between the bit lines 16a and 16b is amplified to a readable level by the sense amplifier 17 since the difference in voltage is generally as extremely small as about several hundreds mV (for example, 100–200 mV), then read out to the outside.

Each of the RAMs 10 and 11 provided in the semiconductor device 1 has the margin widening means shown in FIG. 3, which can increase the difference in voltage between the bit lines 16a and 16b when the sense amplifier 17 of the RAM 10 or 11 is started to widen the data read-out margin.

As shown in FIG. 3, the margin widening means 60 comprises a delay circuit 61 delaying the start timing of the sense amplifier 17 of the RAM 10 or 11 according to a clock signal fed from the outside, and choppers 67 through 69 connected to the sense amplifier 17 of the RAM 10 or 11.

The chopper 67 is connected to the sense amplifier enable switch 17a to be described later of the sense amplifier 17, the chopper 68 to the word line selecting circuit 18, and the chopper 69 to the pre-charging circuit 19.

The delay circuit 61 comprises a selecting circuit 62 and a selecting circuit 63 serially connected to each other. The clock signal inputted to the selecting circuit 62 is passed through the selecting circuit 62 and the selecting circuit 63 to be delayed by a period of time according selection conditions of the selecting circuits 62 and 63, then outputted to the choppers 67 through 69 connected to the selecting circuit 63.

The selecting circuit 62 comprises two circuits 62L and 62H that can be selected, and a switch 62S for selecting either one of the two circuits 62L and 62H. Like the selecting circuit 62, the selecting circuit 63 comprises two circuits 63L and 63H that can be selected, and a switch 63S for selecting either one of the two circuits 63L and 63H. The switch 62S selects the circuit 62L by inputting "0" being as a signal SW[62S], or selects the circuit 62H by inputting "1" being as a signal SW[62S]. Similarly, the switch 63S selects the circuit 63L by inputting "0" as being a signal SW[63S], or selects the circuit 63H by inputting "1" being as a signal SW[63S].

Each of the circuits 62L, 62H, 63L and 63H of the selecting circuits 62 and 63 has one or a plurality of identical inverters 64. Each of the circuits 62L and 63L has one inverter 64. The circuit 62H has five inverters 64 serially connected to one another. The circuit 63H has three inverters 64 serially connected to one another.

The larger the number of stages of the inverters 64 present in the circuit (i.e., in a circuit configured with combination of either one of the circuit 62L or 62H and either one of the circuit 63L or 63H) selected by the switches 62S and 63S, through which the clock signal passes, the more the clock signal is delayed, and outputted to the choppers 67 through 69.

In the delay circuit 61, when the circuit 62L is selected by the switch 62S and the circuit 63L is selected by the switch 63S, the number of stages of the inverters 64 is two, as shown in FIGS. 4 and 5. When the circuit 62L is selected by the switch 62S and the circuit 63H is selected by the switch 63S, the number of stages of the inverters 64 is four. When the circuit 62H is selected by the switch 62S and the circuit 63L is selected by the switch 63S, the number of stages of the inverters 64 is six. When the circuit 62H is selected by the switch 62S and the circuit 63H is selected by the switch 63S, the number of stages of the inverters 64 is eight.

In the margin widening means 60, the number of stages of the inverters 64 present at the time that the inputted clock signal passes through the delay circuit 61 can be gradually adjusted by switching the switches 62S and 63S provided to the selecting circuits 62 and 63 of the delay circuit 61, whereby delay of the inputted clock signal can be gradually adjusted.

Next, description will be made of functions and effects brought by delaying the clock signal by the delay circuit 61 of the margin widening means 60, with reference to FIGS. 6(a) and 6(b).

Figures 6A, 6B:
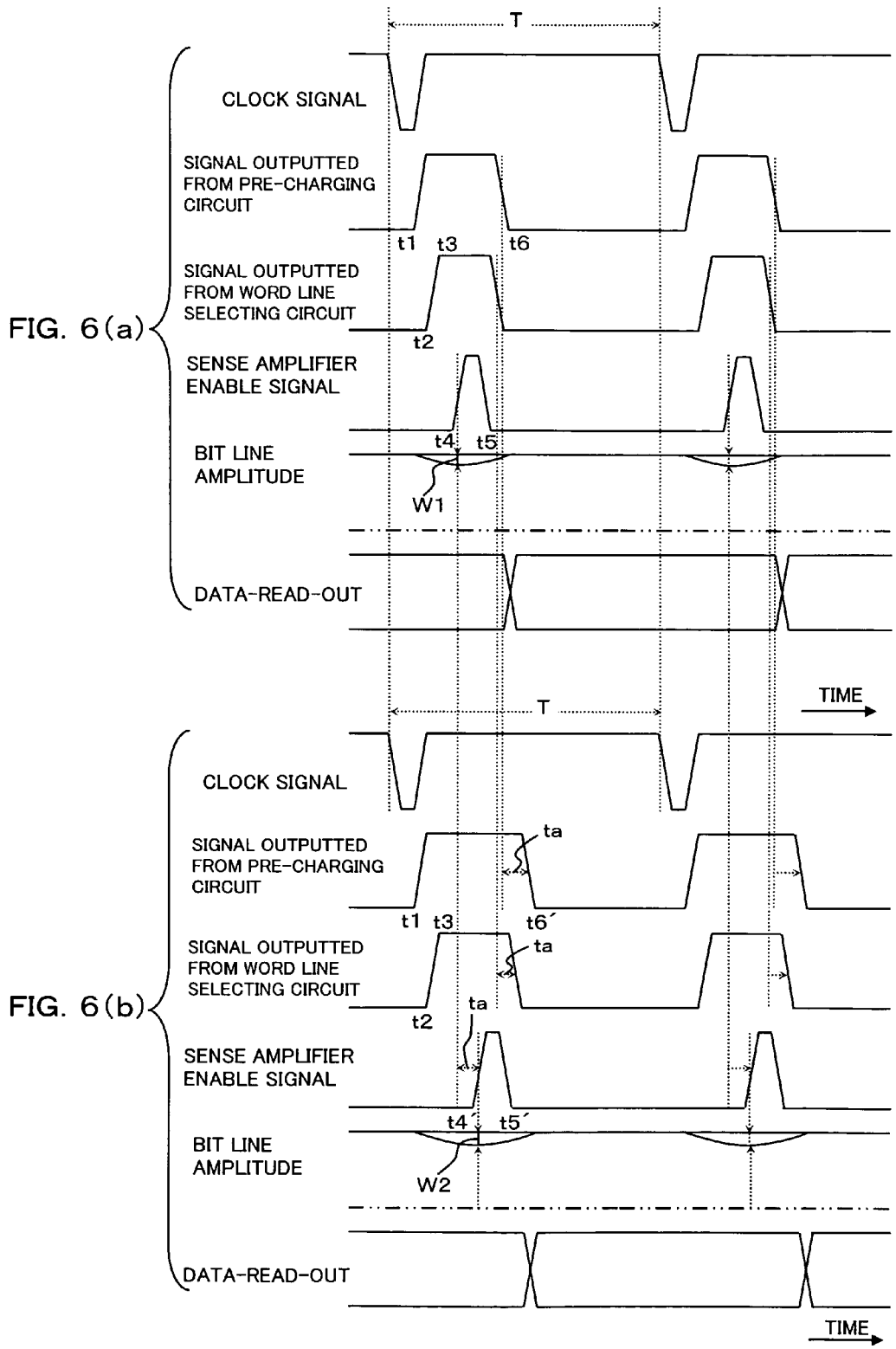
FIG. 6(*a*) is a time chart for illustrating a reading-out operation of a RAM for use in processing of the semiconductor device according to the embodiment of this invention.
Figure 7:
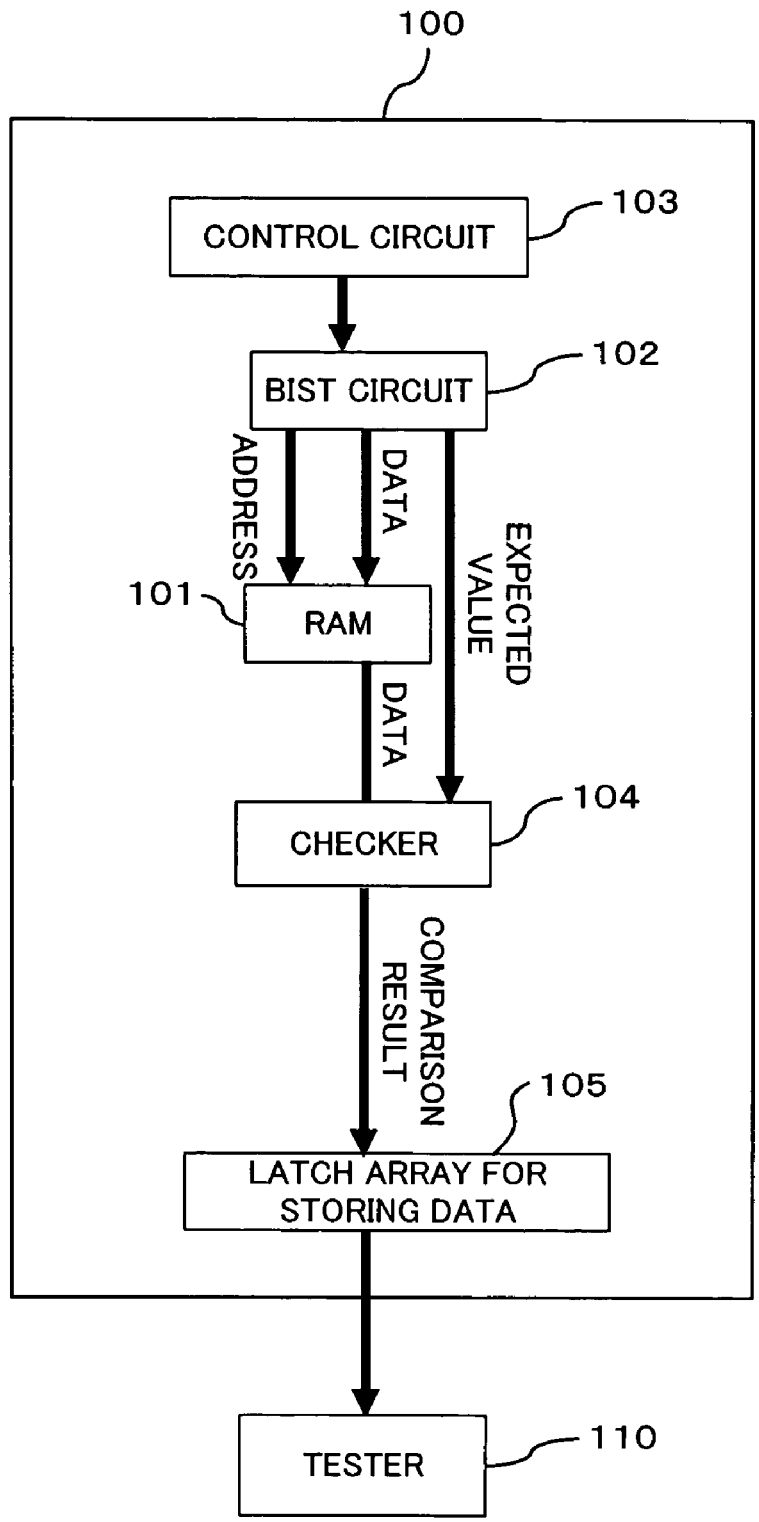
FIG. 7 is a block diagram showing a functional structure of a known semiconductor device.

As shown in FIG. 6(a), in the RAM for use in processing (here, the RAM for use in processing 10) incorporated in the data processing system of the semiconductor device 1, when the clock signal for reading out data to the checker 40 is inputted, release of pre-charge is started as shown by a signal outputted from the pre-charging circuit 19 [refer to t1 in FIG. 6(a)]. With this, a difference in voltage is ready to be generated between the bit line 16a and the bit line 16b. When the pre-charge is completely released, the word line 15 is selected as shown by a signal outputted from the word line selecting circuit 18 [refer to t2 in FIG. 6(a)], and the memory cell 12 in the RAM for use in processing 10 connected to the word line 15 is selected (here, readably) so that data can be written into and read out from the memory cell 12 [refer to t3 in FIG. 6(a)].

When the clock signal is inputted, on the other hand, delay of the clock signal is adjusted in the delay circuit 61 provided to the RAM 10, inputting of the clock signal to the chopper 67 is delayed so that the start of the sense amplifier 17 is delayed. At a point of time when the difference in voltage between the bit lines 16a and 16b becomes large to some degree, that is, at a point of time when the bit line amplitude which is the difference in voltage between the bit lines 16a and 16b becomes W1, a sense amplifier enable signal for the sense amplifier enable switch 17a rises to start the sense amplifier 17 [refer to t4 in FIG. 6(a)]. Here, the control circuit 30 transmits "0" to both the switches 62S and 63S in the delay circuit 61 provided to the RAM 10 to set the number of stages of the inverters 64 in the delay circuit 61 to "two" (refer to "SW[62S:63S]=00" in FIG. 1), which is the minimum number of stages.

As above, it is possible to read out data from the RAM 10 with the data read-out margin being secured to some degree by securing the bit line amplitude (here, the bit line amplitude W1).

Since, it takes some time to start the sense amplifier 17 to start amplification of the difference in voltage between the bit liens 16a and 16b after the sense amplifier enable signal is inputted to the sense amplifier enable switch 17a, an elapse of very short time is required to obtained the bit line amplitude W1 amplified by the sense amplifier 17 after the sense amplifier enable signal is inputted to the sense amplifier enable switch 17a ("t4" in the FIG. 6(a)). The potential difference between the bit lines 16a and 16b (bit line amplitude) is gradually increased after the pre-charge is released as above, and gradually decreased after the potential difference between the bit lines 16a and 16b (bit line amplitude) reaches the maximum value.

When the difference in voltage between the bit lines 16a and 16b is amplified by the sense amplifier 17, the sense amplifier enable signal is switched to the off-state. With this, selection of the word line 15 by the word line selecting circuit 18 is ended [refer to t5 in FIG. 6(a)]. After that, releasing of the pre-charge by the pre-charging circuit 19 is ended, and reading-out of data from the RAM 10 is completed [refer to t6 in FIG. 6(a)].

As above, the above data reading-out operation is completed within a clock cycle (clock cycle unit) T in the RAM for use in processing 10 in the semiconductor device 1.

In the RAMs (the RAM for use in processing 10 and the RAM for tester 11) in the semiconductor device 1 having the structure shown in FIG. 2, the smaller the bit line amplitude amplified by the sense amplifier 17, the smaller the data read-out margin is. In such situation, when the bit line amplitude is read out as data from the RAM, a read error is apt to occur. On the other hand, when the start timing of the sense amplifier 17 is delayed by the delay circuit 61 in the margin widening means 60 in order to secure the data read-out margin, reading-out of data from the RAM takes a longer time due to the delay of the start timing of the sense amplifier 17. Therefore, widening the data read-out margin to certainly read out data and reading-out the data at high speed are in a relationship of trade-off. For this, in the RAM for use in processing 10, the word line amplitude is increased to some degree to secure the data read-out margin within a range in which the data read time is not excessively extended, then the sense amplifier 17 is started.

In the RAM for tester 11 of the semiconductor device 1, a data reading-out operation similar to that performed in the RAM for use in processing 10 shown in FIG. 6(a) is performed: the clock signal is inputted, release of pre-charge is started as shown by a signal outputted from the pre-charging circuit 19, the word line 15 is selected as shown by a signal outputted from the word line selecting circuit 18 and the cell memory 12 in the RAM for tester 11 selected (here, readably) so that data can be written in/read out from the memory cell 12 [refer to t1 through t3 in FIG. 6(b)], as shown in FIG. 6(b).

However, in the RAM for tester 11 of the semiconductor device 1, the input timing of the clock signal to the chopper 67 is adjusted when the clock signal is inputted so that the delay circuit 61 provided to the RAM 11 delays the sense amplifier enable signal to be inputted to the sense amplifier enable switch 17a a longer period of time ta than the delay time in the RAM for use in processing 10 shown in FIG. 6(a). At a point of time that the difference in voltage between the bit lines 16a and 16b (bit line amplitude) becomes W2, which is the maximum value, the sense amplifier enable signal to the sense amplifier enable switch 17a rises to start the sense amplifier 17 [refer to t4' in FIG. 6(a)]. Here, the control circuit 30 transmits "1" to both the switches 62S and 63S of the delay circuit 61 provided to the RAM 11 (refer to "SW[62S:63S]=11" in FIG. 1) to set the number of stages of the inverters. 64 in the delay circuit 61 to the maximum number "8."

Namely, in the RAM for tester 11, the delay circuit 61 of the margin widening means 60 is adjusted so that the data read-out margin is maximum. The RAM for tester 11 has thus a larger data read-out margin than the data read-out margin of the above RAM for use in processing 10.

It takes some time to start the sense amplifier 17 to start amplification of the difference in voltage between the bit lines 16a and 16b (bit line amplitude) after the sense amplifier enable signal is inputted to the sense amplifier enable switch 17a. For this, an elapse of very short time is required to obtain the bit line amplitude W2 amplified by the sense amplifier 17 after the sense amplifier enable signal is inputted to the sense amplifier enable switch 17a ("t4" in the FIG. 6(b)).

When the difference in voltage between the bit lines 16a and 16b is amplified by the sense amplifier 17, the sense amplifier enable signal is switched to the off-state. With this, selection of the word line 15 by the word line selecting circuit 18 is ended [refer to t5' in FIG. 6(a)]. Then, release of the pre-charge by the pre-charging circuit 19 is ended, and reading-out of the data from the RAM 11 is completed [refer to t6' in FIG. 6(a)].

Since the inputted clock signal is delayed by the delay circuit 61 of the margin widening means 60 and inputted to the word line selecting circuit 18 through the chopper 68 as above, the selection period of the word line 15 by the word line selecting circuit 18 is extended by the above period of time ta, thus selection of the word line 15 is ended at the point of time t5' in FIG. 6(b). Namely, the delay circuit 61 and the chopper 68 in the margin widening means together function as an extending circuit extending the word line selection period of the word line selecting circuit 18.

On the other hand, since the inputted clock signal is delayed by the delay circuit 61 in the margin widening means 60 and inputted to the pre-charging circuit 19 through the chopper 69, the pre-charge release period by the pre-charging circuit 19 is extended by the above period of time ta, and the release of the pre-charge is ended at the point of time t6' in FIG. 6(a). Namely, the delay circuit 61 and the chopper 69 in the margin widening means 60 together function as an extending circuit extending the pre-charge release period of the pre-charging circuit 19.

In the RAM for tester 11 in the semiconductor device 1, inputting of the sense amplifier enable signal to the sense amplifier enable switch 17a is delayed by the delay circuit 61 and the chopper 67 in the margin extending means 60 to increase the bit line amplitude at the time of a start of the sense amplifier 17 to the maximum value W2, thereby to widen the data read-out margin. Whereby, data is certainly read out from the above RAM for tester 11. Since the bit line amplitude at the time of a start of the sense amplifier 17 is increased to the maximum value W2 to widen the data read-out margin to the maximum, data is most certainly read out owing to the margin widening means 60. The data reading-out operation is completed within a clock cycle (clock cycle unit) T.

In the semiconductor device 1 structured as above, the tester 50 is connected to the semiconductor device 1, the control circuit 30 controls the BIST circuit 20, and the built-in self test is started on the RAM for use in processing 10. The BIST circuit 20 successively issues test patterns to the RAM for use in processing 10 to write data into the RAM for use in processing 10, prepares an expected value for each of the test patterns, and transmits the expected value to the checker 40. The checker 40 compares data read out from the RAM for use in processing 10 with the expected value transmitted from the BIST circuit 20, and transmits whether or not the data and the expected value agree with each other as a result of the test (here, "1" when the data and the expected value agree with each other, or "0" when not) to the RAM for tester 11. The result of the test is stored at the same address in the RAM for tester 11 as an address in the RAM for use in processing 10 at which the test data has been written, on the basis of the test pattern. Until the result of the test or the like is stored in the RAM for tester 11, the above process is carried out at a processing speed (clock cycle) based on the device of the semiconductor device 1.

The tester 50 relates the result of the test (comparison result) stored in the RAM for tester 11 to the address at which the result of the test has been written, takes out them, makes a bit failure map, evaluates the bit failure map to make the built-in self test on the RAM for use in processing 10. Taking out the result of the test or the like stored in the RAM for tester 11 by the tester 50 is carried out at a processing speed (clock cycle) of the device (MPU, CPU or the like) of the tester 50.

The control circuit 30 transmits, to the RAM for use in processing 10 to be tested, a signal for selecting the switches 62S and 63S in the delay circuit 61 of the margin widening means 60 provided to the RAM for use in processing 10 when controlling the BIST circuit 20 to start the built-in self test, and transmits, to the RAM for tester 11, a signal for selecting the switches 62S and 63S in the delay circuit 61 of the margin widening means 60 provided to the RAM for tester 11, as well. At this time, the data read-out margin of the RAM for tester 11 is set to be greater than the general data read-out margin (the data read-out margin of the RAM for use in processing 10).

In the semiconductor device 1 according to this embodiment of the invention, the RAM 11 is used as a RAM for tester storing results of a test when the RAM 10 between the RAMs 10 and 11 incorporated in the data processing system of the semiconductor device 1 is tested in the built-in self test by the BIST circuit (built-in self test circuit) 20. Unlike the known technique described above, it is unnecessary to newly provide a RAM having a performance equivalent to that of the RAM 10, and to newly provide an interface and a control system for the newly provided RAM. Accordingly, the cost can be decreased.

The RAM for tester 11 is generally manufactured in the same technique as the RAM for use in processing 10, thus these RAMs 11 and 10 have equivalent performances. For this, the built-in self test can be made successively on the whole of the RAM 10 at a processing speed (i.e., the original processing speed of the semiconductor device 1) based on a device (an MPU, CPU or the like) provided in the semiconductor device 1, which guarantees reliable operations of the product.

The semiconductor device according to the embodiment of this invention has the margin widening means 60 in each of the RAMs 10 and 11. The margin expanding means 60 widens the data read-out margin of the RAM for tester 11 storing test results of the built-in self test (comparison results from the checker 40), thereby to certainly read out the test results from the RAM for tester 11, which improves the accuracy of the built-in self test.

When the RAM 11 is tested in the built-in self test, the margin widening means 60 provided to the RAM 10 extends the data read-out margin of the RAM 10, whereby the RAM 10 can be used as a RAM for tester storing test results of the built-in self test on the RAM 11. Even when the semiconductor device 1 has a plurality of RAMs in the data processing system, it is possible to carry out the built-in self test efficiently and at low cost by rationally using the RAMs.

[2] Others

Note that the present invention is not limited to the above example, but may be modified in various ways without departing from the scope of the invention.

For example, the RAMs 10 and 11 being as memories incorporated in the data processing system of the semiconductor device 1 of this invention are SRAMs. However, this invention is not limited to this. The RAMs 10 and 11 may be DRAMs, for example.

In the above embodiment, there are provided two RAMs 10 and 11 being as memories incorporated in the data processing system of the semiconductor device 1 according to this invention, and the RAM 10 is tested in the built-in self test by the BIST circuit 20. However, the RAM 11 may be tested. In which case, the margin widening means 60 provided to the RAMs 10 and 11 are set so that the data read-out margins set in the above embodiment are exchanged with each other.

There may be provided three or more RAMs being as memories incorporated in the data processing system of the semiconductor device 1. In which case, any one of the three RAMs is tested in the built-in self test by the BIST circuit 20 in the above embodiment, and either one of the remaining RAMs functions as the above RAM for tester 11. Further, either one of a plurality of RAMs except a RAM to be tested in the built-in self test may function as a RAM for tester storing only comparison results (here, "1" s) obtained when data outputted from the checker 40 and read out from the tested RAM agree with expected values prepared by the BIST circuit 20, while the other RAM may function as a RAM for tester storing only comparison results (here "0" s) obtained when the data outputted from the checker 40 and read out from the tested RAM do not agree with expected values prepared by the BIST circuit 20.

In the above embodiment, the RAM for tester 11 is a memory incorporated in the data processing system of the semiconductor device 1, normally functioning as a RAM for use in processing. However, this invention is not limited to this. The RAM 11 may be used exclusively for a RAM for tester storing test results of the RAM for use in processing 10 that can be read out by the external tester 50. In which case, the RAM 11 being as the RAM for tester is set to have a larger data read-out margin than the data read-out margin of the RAM for use in processing 10 by the margin widening means 60 provided to the RAM 11.

With the above structure, it is possible to successively make the built-in self test on the whole of the RAM 10 at a processing speed (i.e., the original processing speed of the semiconductor device 1) based on the device (MPU, CPU or the like) provided in the semiconductor device 1, which guarantees reliable operations of the product.

Since, the RAM for tester 11 has a data widening margin larger than that of the RAM for use in processing 10, it is possible to certainly read out test results from the RAM for tester 11, which improves the accuracy of the built-in self test.

What is claimed is:

1. A semiconductor device comprising:
    a RAM for use in processing incorporated in a data processing system and to be tested;
    a built-in self test circuit for making a built-in self test on said RAM for use in processing; and
    a RAM for tester for storing results of said built-in self test on said RAM for use in processing made by said built-in self test circuit so that the results of said built-in self test can be read out by an external tester;
    a RAM having a data read-out margin greater than a data read-out margin of said RAM for use in processing being used as said RAM for tester.

2. A semiconductor device comprising:
    a plurality of RAMs for use in processing incorporated in a data processing system and to be tested; and
    a built-in self test circuit for making a built-in self test on said RAMs for use in processing;
    when said built-in self test circuit makes the built-in self test on a part of said plural RAMs for use in processing, a RAM for use in processing, which is not to be tested in said built-in self test, being used as a RAM for tester which stores results of said built-in self test on said RAM(S) for use in processing made by said built-in self test circuit so that the results of said built-in self test can be read out by an external tester.

3. The semiconductor device according to claim 2, wherein each of said plural RAMs for use in processing comprises a margin widening means for increasing a bit line amplitude at the time of a start of a sense amplifier of said RAM to widen a data read-out margin.

4. The semiconductor device according to claim 3, wherein said margin widening means comprises a delay circuit for gradually delaying a start timing of said sense amplifier according to a signal fed from the outside.

5. The semiconductor device according to claim 4, wherein said margin widening means changes a setting so that a data read-out margin of a RAM used as a RAM for tester among said plural RAMs for use in processing is greater than a data read-out margin of a RAM for use in processing to be tested in said built-in self test.

6. The semiconductor device according to claim 5, wherein each of said plural RAMs for use in processing (further) comprises an extending circuit for extending a pre-charge release period.

7. The semiconductor device according to claim 6, wherein each of said plural RAMs for use in processing further comprises an extending circuit for extending a word selection period.

8. The semiconductor device according to claim 5, wherein each of said plural RAMs for use in processing further comprises an extending circuit for extending a word selection period.

9. The semiconductor device according to claim 4, wherein each of said plural RAMs for use in processing (further) comprises an extending circuit for extending a pre-charge release period.

10. The semiconductor device according to claim 9, wherein each of said plural RAMs for use in processing further comprises an extending circuit for extending a word selection period.

11. The semiconductor device according to claim 4, wherein each of said plural RAMs for use in processing further comprises an extending circuit for extending a word selection period.

12. The semiconductor device according to claim 3, wherein said margin widening means changes a setting so that a data read-out margin of a RAM used as a RAM for tester among said plural RAMs for use in processing is greater than a data read-out margin of a RAM for use in processing to be tested in said built-in self test.

13. The semiconductor device according to claim 12, wherein each of said plural RAMs for use in processing (further) comprises an extending circuit for extending a pre-charge release period.

14. The semiconductor device according to claim 13, wherein each of said plural RAMs for use in processing further comprises an extending circuit for extending a word selection period.

15. The semiconductor device according to claim 12, wherein each of said plural RAMs for use in processing further comprises an extending circuit for extending a word selection period.

16. The semiconductor device according to claim 3, wherein each of said plural RAMs for use in processing (further) comprises an extending circuit for extending a pre-charge release period.

17. The semiconductor device according to claim 16, wherein each of said plural RAMs for use in processing further comprises an extending circuit for extending a word selection period.

18. The semiconductor device according to claim 3, wherein each of said plural RAMs for use in processing further comprises an extending circuit for extending a word selection period.

19. A testing apparatus built in a semiconductor device comprising a RAM for use in processing incorporated in a data processing system and to be tested, said testing apparatus comprising:
 a built-in self test circuit for making a built-in self test on said RAM for use in processing; and
 a RAM for tester for storing results of said built-in self test on said RAM for use in processing made by said built-in self test circuit so that the results of said built-in self test can be read out by an external tester;
 a RAM having a data read-out margin greater than a data read-out margin of said RAM for use in processing being used as said RAM for tester.

20. A testing apparatus built in a semiconductor device comprising a plurality of RAMs for use in processing incorporated in a data processing system and to be tested, said testing apparatus comprising:
 a built-in self test circuit for making a built-in self test on said plural RAMs for use in processing;
 when said built-in self test circuit makes the built-in self test on a part of said plural RAMs for use in processing, a RAM for use in processing, which is not to be tested in said built-in self test, being used as a RAM for tester which stores results of said built-in self test on said RAM(s) for use in processing made by said built-in self test circuit so that the results of said built-in self test can be read out by an external tester.

21. The testing apparatus for a semiconductor device according to claim 20, wherein each of said plural RAMs for use in processing comprises a margin widening means for increasing a bit line amplitude at the time of a start of a sense amplifier of said RAM to widen a data read-out margin.

22. The testing apparatus for a semiconductor device according to claim 21, wherein said margin widening means comprises a delay circuit for gradually delaying a start timing of said sense amplifier according to a signal fed from the outside.

23. The testing apparatus for a semiconductor device according to claim 22, wherein said margin widening means changes a setting so that a data read-out margin of a RAM used as a RAM for tester among said plural RAMs for use in processing is greater than a data read-out margin of a RAM for use in processing to be tested in said built-in self test.

24. The testing apparatus for a semiconductor device according to claim 23, wherein each of said plural RAMs for use in processing further comprises an extending circuit for extending a pre-charge release period.

25. The testing apparatus for a semiconductor device according to claim 24, wherein each of said plural RAMs for use in processing further comprises an extending circuit for extending a word line selection period.

26. The testing apparatus for a semiconductor device according to claim 23, wherein each of said plural RAMs for use in processing further comprises an extending circuit for extending a word line selection period.

27. The testing apparatus for a semiconductor device according to claim 22, wherein each of said plural RAMs for use in processing further comprises an extending circuit for extending a pre-charge release period.

28. The testing apparatus for a semiconductor device according to claim 27, wherein each of said plural RAMs for use in processing further comprises an extending circuit for extending a word line selection period.

29. The testing apparatus for a semiconductor device according to claim 22, wherein each of said plural RAMs for use in processing further comprises an extending circuit for extending a word line selection period.

30. The testing apparatus for a semiconductor device according to claim 21, wherein said margin widening means changes a setting so that a data read-out margin of a RAM used as a RAM for tester among said plural RAMs for use in processing is greater than a data read-out margin of a RAM for use in processing to be tested in said built-in self test.

31. The testing apparatus for a semiconductor device according to claim 30, wherein each of said plural RAMs for use in processing further comprises an extending circuit for extending a pre-charge release period.

32. The testing apparatus for a semiconductor device according to claim 31, wherein each of said plural RAMs for use in processing further comprises an extending circuit for extending a word line selection period.

33. The testing apparatus for a semiconductor device according to claim 30, wherein each of said plural RAMs for use in processing further comprises an extending circuit for extending a word line selection period.

34. The testing apparatus for a semiconductor device according to claim 21, wherein each of said plural RAMs for use in processing further comprises an extending circuit for extending a pre-charge release period.

35. The testing apparatus for a semiconductor device according to claim 34, wherein each of said plural RAMs for use in processing further comprises an extending circuit for extending a word line selection period.

36. The testing apparatus for a semiconductor device according to claim 21, wherein each of said plural RAMs for use in processing further comprises an extending circuit for extending a word line selection period.

* * * * *

UNITED STATES PATENT AND TRADEMARK OFFICE
CERTIFICATE OF CORRECTION

| | |
|---|---|
| PATENT NO. | : 7,038,955 B2 |
| APPLICATION NO. | : 10/815825 |
| DATED | : May 2, 2006 |
| INVENTOR(S) | : Susuki et al. |

It is certified that error appears in the above-identified patent and that said Letters Patent is hereby corrected as shown below:

Col. 14, line 14, delete "RAM(S)" and insert --RAM(s)--, therefor.

Signed and Sealed this

Eighth Day of August, 2006

JON W. DUDAS
*Director of the United States Patent and Trademark Office*